United States Patent
Galloway et al.

(10) Patent No.: US 7,906,845 B1
(45) Date of Patent: Mar. 15, 2011

(54) SEMICONDUCTOR DEVICE HAVING REDUCED THERMAL INTERFACE MATERIAL (TIM) DEGRADATION AND METHOD THEREFOR

(75) Inventors: Jesse E. Galloway, Chandler, AZ (US); Sasanka Laxmi Narasimha Kanuparthi, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 161 days.

(21) Appl. No.: 12/108,419

(22) Filed: Apr. 23, 2008

(51) Int. Cl.
*H01L 23/10* (2006.01)
*H01L 23/34* (2006.01)

(52) U.S. Cl. .................. 257/707; 257/E23.106
(58) Field of Classification Search .................. 257/704, 257/706, 707, E23.106
See application file for complete search history.

(56) References Cited

U.S. PATENT DOCUMENTS

| | | | |
|---|---|---|---|
| 3,337,678 A | 8/1967 | Stelmak | |
| 3,422,320 A | 1/1969 | Woodling | |
| 3,504,096 A | 3/1970 | Nagal | |
| 3,538,597 A | 11/1970 | Leinkram et al. | |
| 4,577,056 A | 3/1986 | Butt | |
| 5,268,533 A | 12/1993 | Kovacs et al. | |
| 5,469,329 A | 11/1995 | Reddy et al. | |
| 6,429,512 B1 | 8/2002 | Huang et al. | |
| 6,462,410 B1 * | 10/2002 | Novotny et al. | 257/707 |
| 6,504,242 B1 | 1/2003 | Deppisch et al. | |
| 6,611,054 B1 | 8/2003 | Dunaway et al. | |
| 6,751,099 B2 * | 6/2004 | Vrtis et al. | 361/705 |
| 6,921,970 B2 | 7/2005 | Shiomi et al. | |
| 7,081,375 B2 | 7/2006 | Baek et al. | |
| 7,173,331 B2 | 2/2007 | Matsubara et al. | |
| 7,223,638 B2 | 5/2007 | Starkston | |
| 2003/0080411 A1 * | 5/2003 | Baek et al. | 257/704 |
| 2005/0280142 A1 | 12/2005 | Hua et al. | |

FOREIGN PATENT DOCUMENTS

JP 06053341 2/1994

* cited by examiner

*Primary Examiner* — David A Zarneke
*Assistant Examiner* — Jenny L Wagner
(74) *Attorney, Agent, or Firm* — Weiss & Moy, P.C.

(57) ABSTRACT

A semiconductor device has a substrate having a top and bottom surface and a plurality of metal layers. A first die is electrically coupled to the top surface of the substrate. A lid member is attached to a top surface of the die and to the top surface of the substrate. A layering is formed on portions of a top surface of the lid member. The layering will have a different coefficient of thermal expansion (CTE) than the lid member.

20 Claims, 4 Drawing Sheets

SEMICONDUCTOR DEVICE HAVING REDUCED THERMAL INTERFACE MATERIAL (TIM) DEGRADATION AND METHOD THEREFOR

FIELD OF THE INVENTION

This invention relates to semiconductor devices and, more specifically, to a semiconductor device and method to reduce warpage caused by temperature changes leading to thermal interface material (TIM) degradation.

BACKGROUND OF THE INVENTION

In a flip chip semiconductor device, a semiconductor die is mounted directly onto a substrate, board, or carrier (hereinafter substrate). Electrical connection is achieved through conductive bumps formed on the surface of the semiconductor die. The conductive bumps are aligned with conductive patterns on the substrate. A non-conductive filler material is applied to the open spaces between the surface of the semiconductor die and the substrate. The non-conductive filler material is used to protect the interface between the conductive bumps on the surface of the semiconductor die and the conductive patterns on the substrate from moisture, contaminants, and other environmental hazards. The non-conductive filler material further aids in securing the semiconductor die to the substrate.

A protective covering is then formed over the semiconductor die, the non-conductive filler material, and the substrate. The protective covering may be an encapsulant. Alternatively, a lid may be positioned over the semiconductor die and attached to the substrate. In some situations, the lid is used not only as a protective covering but also as a way to dissipate heat from the semiconductor die. The lid is generally formed of a metallic material. However, ceramic material may be used as well.

The lid is attached to the semiconductor die and the substrate. The material used to attach the lid to the semiconductor die is different from the material used to attach the lid to the substrate. In general, a thermal interface material (TIM) such as silicone loaded with high thermal conductivity material is placed between the semiconductor die to the lid. This type of material aids in the dissipation of heat from the semiconductor die to the lid. An adhesive material is generally used to attach the lid to the substrate.

A problem with lidded semiconductor devices is that thermal interface material (TIM) degradation may occur. The degradation is due to excessive mechanical strains induced within the TIM when the semiconductor device undergoes severe temperature excursions. These temperature excursions may occur during processing steps subsequent to lid attachment such as moisture resistance testing (MRT), or in the field, such as those produced during power cycling. Semiconductor devices warp in response to a change in temperature and differences in thermal expansion coefficient in lid, die and substrate. Excessive warpage causes failure between the semiconductor die and TIM interface and the lid and the TIM interface.

Therefore, a need exists to provide a device and method to overcome the above problems. The device and method would reduce the adhesive failure between the semiconductor die and TIM interfaces and the lid and the TIM interfaces due to lid warpage.

SUMMARY OF THE INVENTION

A semiconductor device has a substrate having a top and bottom surface and a plurality of metal layers. A first die is electrically coupled to the top surface of the substrate. A lid member is attached to a top surface of the die and to the top surface of the substrate. A layering is formed on portions of a top surface of the lid member. The layering will have a different coefficient of thermal expansion (CTE) than the lid member.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
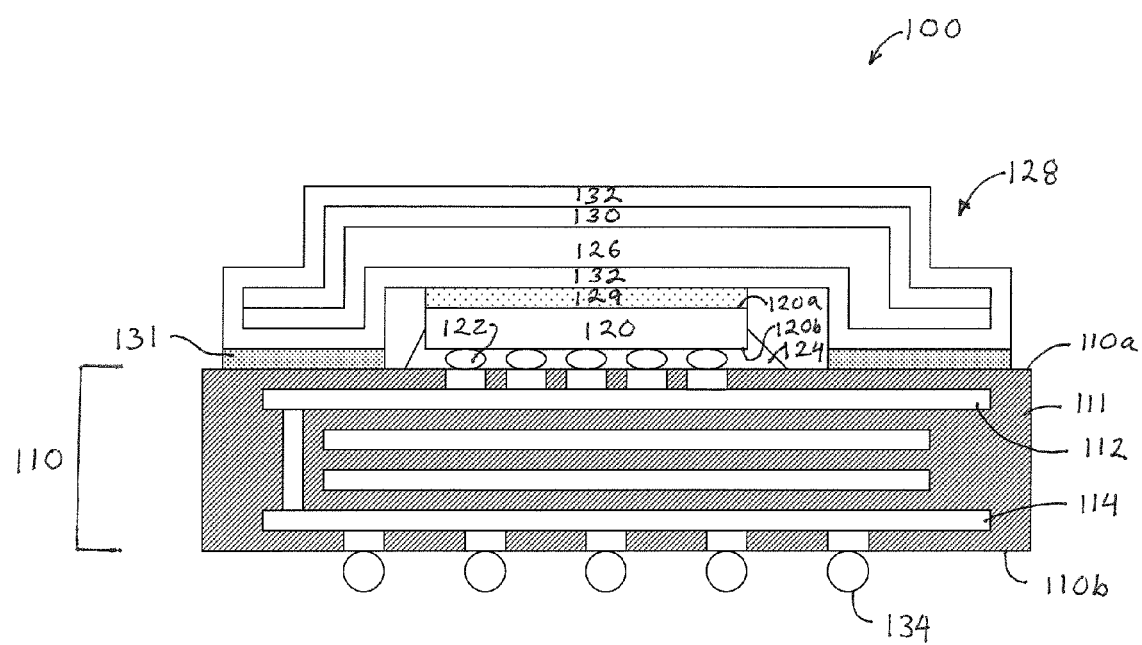
FIG. 1 is a cross-sectional view of a semiconductor device according to a one embodiment of the present invention.

Referring to FIG. 1, a cross-sectional view of semiconductor device 100 according to one embodiment of the present invention is illustrated. The semiconductor device 100 has a substrate 110. The substrate 110 includes an insulating layer 111 having an approximately planar first surface 110a and an approximately planar second surface 110b opposite to the first surface 110. The substrate 110 will have conductive patterns formed on one or more layers thereof. In the embodiment shown in FIG. 1, the substrate 110 has a plurality of first conductive patterns 112 formed on the first surface 110a, and a plurality of second conductive patterns 114 formed on the second surface 110b. In the embodiment shown, at least one first conductive pattern 112 and at least one second conductive pattern 114 may be electrically connected to each other through a conductive via hole 116. The substrate 110 may be any one of a general hard printed circuit substrate and a flexible printed circuit substrate or an equivalent thereof. However, the present invention is not limited thereto.

A first semiconductor die 120 is electrically coupled to the first surface 110a of the first substrate 110. In the embodiment shown in FIG. 1, the first semiconductor die 120 is electrically coupled to the first surface 110a of the first substrate 110 through a flip chip assembly. The first semiconductor die 120 has an approximately planar first surface 120a and an approximately planar second surface 120b opposite to the first surface 120a. One or more conductive bumps 122 are formed on the second surface 120b of first semiconductor die 120. The conductive bumps 122 are generally formed on the second surface 120b of first semiconductor die 120 through an under bump metallization (UBM) process. The second surface 120b of the first semiconductor die 120 is attached onto the first surface 110a of the substrate 110 so that the conductive bumps 122 are placed on bond pads 118 formed on the first conductive patterns 112 on the first surface 110a of the substrate 110.

A non-conductive filler material 124 is applied to the open spaces between the second surface 120b of the first semiconductor die 120 and the first surface 110a of the substrate 110. The non-conductive filler material 124 is used to protect the conductive bumps 122 and the second surface 120B of the first semiconductor die 120 from moisture, contaminants, and other environmental hazards. The non-conductive filler material 124 further helps to secure the second surface 120b of the first semiconductor die 120 to the first surface 110a of the substrate 110, thereby reducing the differences between the expansion of the first semiconductor die 120 and the substrate 110.

A lid member 126 is attached to the first surface 120a of the first semiconductor die 120 and the first surface 110a of the substrate 110. In general, different materials are used to attach the lid member 126 to the first surface 120a of the first semiconductor die 120 and the lid member 126 to the first surface 110a of the substrate 110. The lid member 126 is generally adhered to the first surface 120a of the first semiconductor die 120 by a thermal interface material (TIM) 129. The TIM 129 is used to aid in the transfer of heat from the first surface 120a of the first semiconductor die 120 to the lid member 126. The TIM 129 may be a silicone having high conductivity filler material mixed therein or the like. The above is just one example and should not be seen as to limit the scope of the present invention. An adhesive/sealant material 131 (hereinafter adhesive 131) is generally used to attach the lid member 126 to the first surface 110a of the substrate 110. The adhesive material 131 may be a paste, a tape, or the like.

The lid member 126 is generally formed of a metallic material. In accordance with one embodiment, the lid member 126 is formed of copper. However, this is given as an example and should not be seen as to limit the scope of the present invention. In order to reduce the problems associated with TIM degradation, the lid member 126 will have a non-uniform layering 128 formed on the lid member 126. The material of the non-uniform layering 128 will have a different coefficient of thermal expansion (CTE) than the material of the lid member 126. In accordance with one embodiment of the present invention, the material of the non-uniform layering 128 will have a lower CTE than the material of the lid member 126. By having the non-uniform layering 128, one side of the lid member 126 will consist of a thicker profile having a material with a different CTE than the material used to form the lid member 126. This will induce a warpage in the lid member 126 when subjected to extreme temperature environments. The warpage of the lid member 126 will oppose and offset the warpage of the substrate 110 and the first semiconductor die 120 thereby preventing large strains in the TIM interface during extreme temperature excursions.

In accordance with one embodiment of the present invention, the non-uniform layer 128 may be approximately 5-20% of the total thickness of the lid member 126. The non-uniform layering 128 may be formed of stainless steel, nickel, and the like. The listing of the above materials is given as an example and should not be seen as to limit the scope of the present invention. Different software algorithms may be used to extrapolate the size, shape, and thickness of the non-uniform layering 128 to oppose and offset the warpage of the substrate 110 and the first semiconductor die 120. The software algorithms will be able to analyze how extreme temperature excursions will affect different materials that may be used for the lid member 126 and the non-uniform layering 128.

In accordance with one embodiment of the present invention, the non-uniform layering 128 has a first layer 130 formed on portions of a top surface of the lid member 126. A second layer 132 is then formed on the first layer 130 and exposed areas on the top surface, bottom surface, and side surfaces of the lid member 126. The first layer 130 is formed of material having a different CTE than the material used to form the lid member 126. In accordance with one embodiment, the first layer 130 is formed of a material having a lower CTE than the material used to form the lid member 126. By using the first layer 130, one side of the lid member 126 will consist of a thicker profile having a material with a different CTE than the material of the lid member 126. This will induce a warpage in the lid member 126 when subjected to extreme temperature environments. The warpage of the lid member 126 will oppose and offset the warpage of the substrate 110 and the first semiconductor die 120 thereby preventing large strains in the TIM interface during extreme temperature excursions. In accordance with one embodiment of the present invention, the first layer 130 is formed of material such as stainless steel, nickel, or the like. The second layer 132 may also be formed of stainless steel, nickel and the like. The second layer 132 serves as a protective outer layer and will be less than 1% thickness of lid member 126.

Contacts 134 are electrically connected to the second conductive patterns 114 formed on the second surface 110b of the substrate 110. In the embodiment shown in FIG. 1, the contacts 134 are solder balls 134A. The solder balls 134A function to be electrically connected to an external circuit board, and to send and receive electrical signals of the semiconductor package 100 to outside devices via the circuit board. The solder balls 134 may be formed of Sn/Pb and Leadless Sn, or an equivalent thereof. However, the present invention does not particularly limit the material of the solder balls 134 to the aforementioned. Other materials may be used without departing from the spirit and scope of the present invention.

Figure 2:
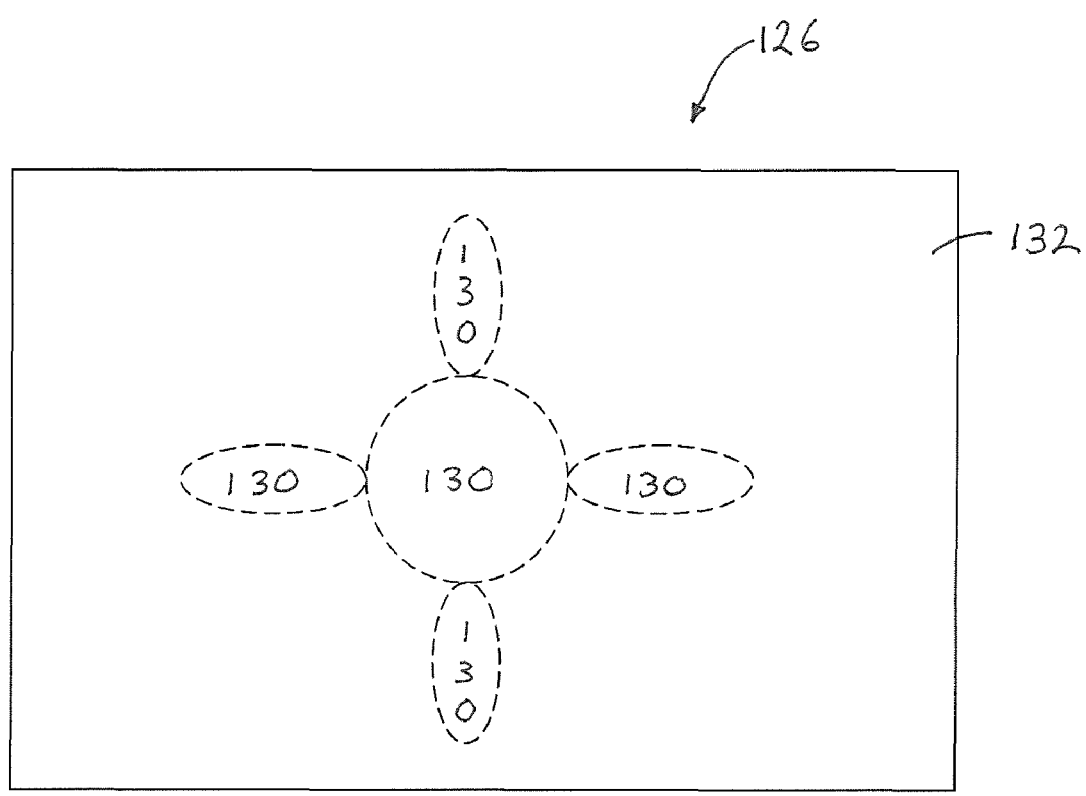
FIG. 2 is a top view of one embodiment of the present invention.

Referring to FIG. 2, another embodiment of the non-uniform layering 128 is shown. In this embodiment, the non-uniform layering 128 is patterned. When applying the non-uniform layering 128, different shapes are formed on portions of a top surface of the lid member 126. These different shapes of the non-uniform layering 128 are used to achieve the desired level of warpage control on the lid member 126. The patterns may be related to hot spots on the first semiconductor die 120. Different software algorithms may be used to extrapolate the size, shape, and thickness of the pattern to be used.

Figure 3:
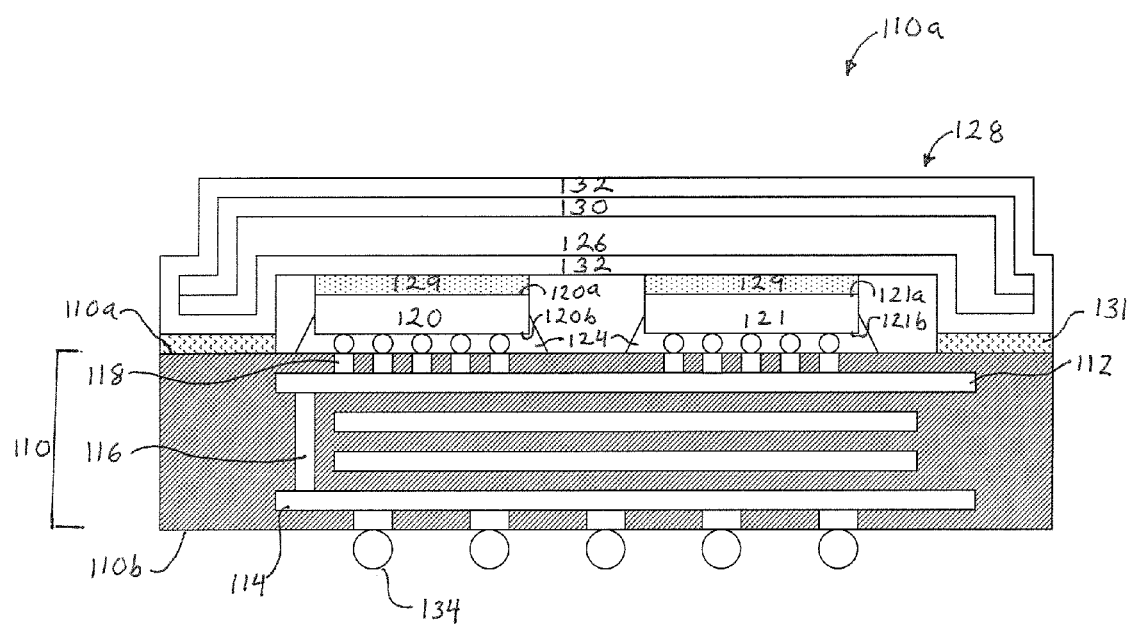
FIG. 3 is a cross-sectional view of a semiconductor device according to another embodiment of the present invention.

Referring to FIG. 3, another embodiment of the semiconductor device 100A is shown. In this embodiment, the semiconductor device 100A is a multi-die module. The semiconductor device 100A will have a substrate 110 having an insulating layer 111 having first conductive patterns 112 formed on the first surface 110a, and a plurality of second conductive patterns 114 formed on the second surface 110b. The first semiconductor die 120 is electrically coupled to the first surface 110a of the first substrate 110. A second semiconductor die 121 is also electrically coupled to the first surface 110a of the substrate 110. In the embodiment shown in FIG. 3, the first semiconductor die 120 and the second semiconductor die 121 are electrically coupled to the first surface 110a of the first substrate 110 through a flip chip assembly.

Non-conductive filler material 124 is applied to the open spaces between the second surface 120b of the first semiconductor die 120 and the first surface 110a of the substrate 110 and a second surface 121b of the second semiconductor die 121 and the first surface 110a of the substrate 110. The non-conductive filler material 124 is used to protect the interface between the conductive bumps 122 of the first and second semiconductor dies 120 and 121 and the first surface 110a of the substrate 110 from moisture, contaminants, and other environmental hazards. The non-conductive filler material 124 further helps to secure the second surfaces 120b and 121b of the first and second semiconductor dies 120 and 121 respectively to the first surface 110a of the first substrate 110.

The lid member 126 is attached to the first surfaces 120a and 121a of the first and second semiconductor dies 120 and 121 and the first surface 110a of the substrate 110. The lid member 126 is generally adhered to the first surfaces 120a and 121a of the first and second semiconductor dies 120 and 121 by a thermal interface material (TIM) 129. The TIM 129 is used to aid in the transfer of heat from the first surfaces 120a and 121a of the first and second semiconductor dies 120 and 121 to the lid member 126. The TIM 129 may be a silicone having high thermal conductivity material mixed therein or the like. An adhesive material 131 is generally used to attach the lid member 126 to the first surface 110a of the substrate 110. The adhesive material 131 may be a paste, a tape, or the like.

The lid member 126 is generally formed of a metallic material. In accordance with one embodiment, the lid member 126 is formed of copper. However, this is given as an example and should not be seen as to limit the scope of the present invention. In order to reduce the problems associated with TIM degradation, the lid member 126 will have a non-uniform layering 128 formed on the lid member 126. The material of the non-uniform layering 128 will have a different coefficient of thermal expansion (CTE) than the material of the lid member 126. In accordance with one embodiment of the present invention, the material of the non-uniform layering 128 will have a lower CTE than the material of the lid member 126. By having the non-uniform layering 128, one side of the lid member 126 will consist of a thicker profile having a material with a different CTE than the material used to form the lid member 126. This will induce a warpage in the lid member 126 when subjected to extreme temperature environments. The warpage of the lid member 126 will oppose and offset the warpage of the substrate 110 and the first and second semiconductor dies 120 and 121 thereby preventing large strains in the TIM interfaces during extreme temperature excursions.

In accordance with one embodiment of the present invention, the non-uniform layering 128 has a first layer 130 formed on portions of the top surface of the lid member 126. The first layer 130 is generally formed in areas above the first and second semiconductor dies 120 and 121. A second layer 132 is then formed on the first layer 130 and exposed areas on the top surface, side surfaces and bottom surface of the lid member 126.

The first layer 130 is formed of material having a different CTE than the material used to form the lid member 126. In accordance with one embodiment, the first layer 130 is formed of a material having a lower CTE than the material used to form the lid member 126. By using the first layer 130, one side of the lid member 126 will a thicker profile having a material with a different CTE than the material of the lid member 126. This will induce a warpage in the lid member 126 when subjected to extreme temperature environments. The warpage of the lid member 126 will oppose and offset the substrate/die warpage thereby preventing large strains in the TIM interfaces during extreme temperature excursions. In accordance with one embodiment of the present invention, the first layer 130 is formed of material such as stainless steel, nickel, or the like. The second layer 132 may also be formed of stainless steel, nickel and the like. The second layer 132 serves as a protective outer layer and will be less than 1% total thickness of the lid member 126.

Contacts 134 are electrically connected to the second conductive patterns 114 formed on the second surface 110b of the substrate 110. In the embodiment shown in FIG. 1, the contacts 134 are solder balls 134A. The solder balls 134A function to be electrically connected to an external circuit board, and to send and receive electrical signals of the semiconductor package 100 to outside devices via the circuit board. The solder balls 134 may be formed of Sn/Pb and Leadless Sn, or an equivalent thereof. However, the present invention does not particularly limit the material of the solder balls 134 to the aforementioned. Other materials may be used without departing from the spirit and scope of the present invention.

Figure 4:
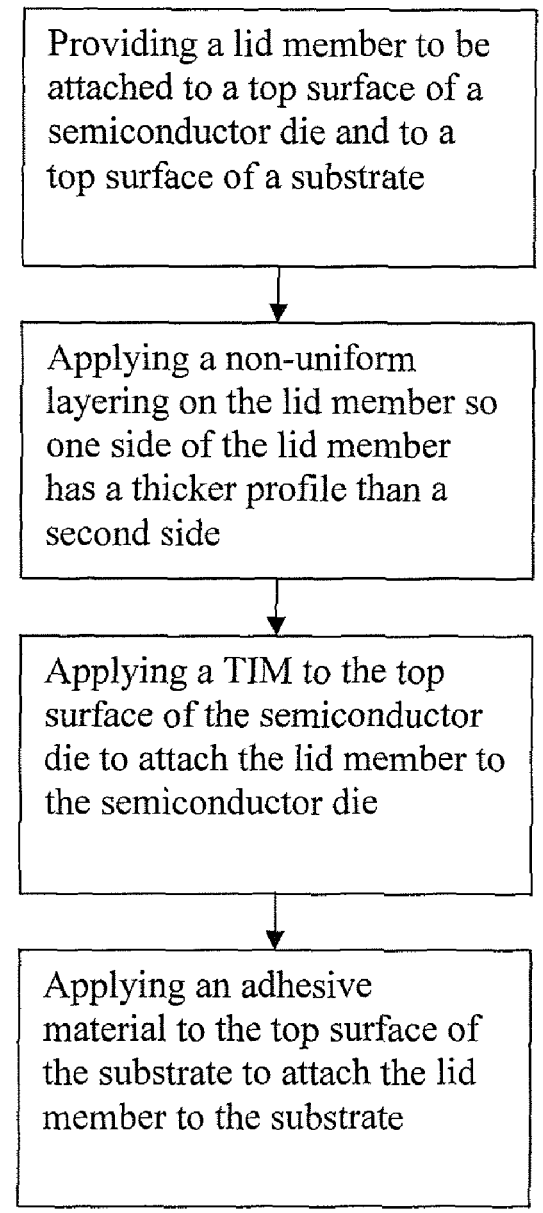
FIG. 4 is a flowchart of a manufacturing method of a semiconductor package module according to an embodiment of the present invention.

Referring to FIG. 4, a method is disclosed which reduces TIM degradation due to warpage caused by temperature changes. In the method, a lid member 126 is provided and is to be attached to the first surface 120a of the first semiconductor die 120 and the first surface 110a of the substrate 110. Prior to attachment, a non-uniform layering 128 is formed on the lid member 126. The material of the non-uniform layering 128 will have a different coefficient of thermal expansion (CTE) than the material of the lid member 126. By having the non-uniform layering 128, one side of the lid member 126 will a thicker profile having a material with a different CTE than the material used to form the lid member 126. This will induce a warpage in the lid member 126 when subjected to extreme temperature environments. The warpage of the lid member 126 will oppose and offset the substrate/die warpage thereby preventing large strains in the TIM interfaces during extreme temperature excursions. Different software algorithms may be used to extrapolate the size, shape, and thickness of the non-uniform layering 128. Once the non-uniform layering 128 is applied to the lid member 126, the lid member is attached to the first surface 120a of the first semiconductor die 120 and the first surface 110a of the substrate 110 as disclosed above.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:
   a substrate having a top and bottom surface, and a plurality of metal layers;
   a first die electrically coupled to the top surface of the substrate;
   a lid member attached to a top surface of the die and to the top surface of the substrate; and
   a layering formed on portions of a top surface of the lid member, on a bottom surface of the lid member, and side surface of the lid member, the layering comprising:
   a first layer formed on portions of the top surface of the lid member, void areas in the first layer forming exposed areas on remaining portions on the top surface of the lid member; and
   a second layer formed on the first layer and exposed portions on the top surface of the lid member, the bottom surface of the lid member, and side surfaces of the lid member.

2. A semiconductor device in accordance with claim 1 wherein the first die is electrically coupled to the top surface of the substrate by flip chip bonding.

3. A semiconductor device in accordance with claim 1 wherein the layering is formed so the top surface of the lid member will have a thicker profile than the bottom surface of the lid member.

4. A semiconductor device in accordance with claim 1 wherein the first layer is applied in a predetermined pattern on the top surface of the lid member, the void areas in the first layer forming the exposed portions on the top surface.

5. A semiconductor device in accordance with claim 1 wherein the layering will have a lower CTE than the lid member.

6. A semiconductor device in accordance with claim 1 further comprising a second die electrically coupled to the top surface of the substrate, wherein the second die is a flip chip, the lid member attached to top surfaces of the first and second die and to the top surface of the substrate.

7. A semiconductor device in accordance with claim 1 further comprising:
   a thermal interface material (TIM) applied to the top surface of the first semiconductor die to attach the lid member to the first semiconductor die; and
   an adhesive material applied to the top surface of the substrate to attach the lid member to the substrate.

8. A semiconductor device in accordance with claim 1 wherein the second layer has a thickness less than 1% of a thickness of the lid member.

9. A semiconductor device in accordance with claim 2 further comprising a non-conductive filler material applied to open spaces formed between a bottom surface of the first semiconductor die and the top surface of the substrate.

10. A semiconductor device in accordance with claim 6 further comprising a non-conductive filler material applied to open spaces formed between a bottom surface of the first semiconductor die and the top surface of the substrate and a bottom surface of the second semiconductor die and the top surface of the substrate.

11. A semiconductor device comprising:
    a substrate having a top and bottom surface, and a plurality of metal layers;
    a first die electrically coupled to the top surface of the substrate;
    a lid member attached to a top surface of the die and to the top surface of the substrate; and
    a layering formed on portions of a top surface of the lid member, a bottom surface of the lid member and side surfaces of the lid member, wherein the layering will have a different coefficient of thermal expansion (CTE) than the lid member, wherein the layering is formed so the top surface of the lid member will have a thicker profile than the bottom surface of the lid, wherein the layering comprises:
    a first layer formed on portions of the top surface of the lid member, void areas in the first layer forming exposed areas on remaining portions on the top surface of the lid member; and
    a second layer formed on the first layer and exposed areas on the top surface of the lid member, the bottom surface of the lid member, and side surfaces of the lid member.

12. A semiconductor device in accordance with claim 11 wherein the first layer is applied in a predetermined pattern on the top surface of the lid member forming the exposed areas on the top surface of the lid member.

13. A semiconductor device in accordance with claim 11 wherein the layering will have a lower CTE than the lid member.

14. A semiconductor device in accordance with claim 11 further comprising a second die electrically coupled to the top surface of the substrate, wherein the second die is a flip chip, the lid member attached to top surfaces of the first and second die and to the top surface of the substrate.

15. A semiconductor device in accordance with claim 11 further comprising:
    a thermal interface material (TIM) applied to the top surface of the first semiconductor die to attach the lid member to the first semiconductor die; and
    an adhesive material applied to the top surface of the substrate to attach the lid member to the substrate.

16. A semiconductor device in accordance with claim 11 further comprising a non-conductive filler material applied to open spaces formed between a bottom surface of the first semiconductor die and the top surface of the substrate.

17. A semiconductor device in accordance with claim 14 further comprising a non-conductive filler material applied to open spaces formed between a bottom surface of the first semiconductor die and the top surface of the substrate and a bottom surface of the second semiconductor die and the top surface of the substrate.

18. A semiconductor device comprising:
    a substrate having a top and bottom surface, and a plurality of metal layers;
    a first die electrically coupled to the top surface of the substrate;
    a lid member attached to a top surface of the die and to the top surface of the substrate; and
    a layering formed on portions of a top surface of the lid member, a bottom surface of the lid member, and side surfaces of the lid member, wherein the layering will have a lower coefficient of thermal expansion (CTE) than the lid member, wherein the layering is formed so the top surface of the lid member will have a thicker profile than the bottom surface, wherein the layering comprises:
    a first layer formed on portions of the top surface of the lid member, void areas in the first layer forming exposed areas on remaining portions on the top surface of the lid member; and
    a second layer formed on the first layer and exposed areas on the top surface on the lid member, bottom surface of the lid member, and side surfaces of the lid member.

19. A semiconductor device in accordance with claim 18 wherein the first layer is applied in a predetermined pattern on the top surface of the lid member forming the exposed areas on the top surface of the lid member.

20. A semiconductor device in accordance with claim 18 further comprising:
    a thermal interface material (TIM) applied to the top surface of the first semiconductor die to attach the lid member to the first semiconductor die; and
    an adhesive material applied to the top surface of the substrate to attach the lid member to the substrate.

* * * * *